(12) United States Patent
Hu et al.

(10) Patent No.: US 8,663,485 B2
(45) Date of Patent: Mar. 4, 2014

(54) METHOD OF MANUFACTURING PLASTIC METALLIZED THREE-DIMENSIONAL CIRCUIT

(75) Inventors: Chuan Ling Hu, Taipei (TW); Chen Lung Tsai, Taipei (TW); Yu Wei Chen, New Taipei (TW); Chen Hao Chang, Taoyuan County (TW)

(73) Assignees: Chuan Ling Hu, New Taipei (TW); ICT-Lanto Limited, Fotan Nt (HK)

( * ) Notice: Subject to any disclaimer, the term of this patent is extended or adjusted under 35 U.S.C. 154(b) by 174 days.

(21) Appl. No.: 13/340,725

(22) Filed: Dec. 30, 2011

(65) Prior Publication Data

US 2013/0126465 A1 May 23, 2013

(30) Foreign Application Priority Data

Nov. 18, 2011 (TW) .............................. 100142190 A

(51) Int. Cl.
*C23F 17/00* (2006.01)
*H05K 3/10* (2006.01)
*C23C 28/02* (2006.01)

(52) U.S. Cl.
CPC .............. *C23F 17/00* (2013.01); *C23C 28/021* (2013.01); *H05K 3/10* (2013.01)
USPC .............................................. 216/13; 29/846

(58) Field of Classification Search
CPC .......... C23F 17/00; C23C 28/021; H01K 3/10
USPC ................................................ 216/13; 29/846
See application file for complete search history.

(56) References Cited

U.S. PATENT DOCUMENTS

| | | | | |
|---|---|---|---|---|
| 5,066,360 A | * | 11/1991 | Daley et al. | ...................... 216/13 |
| 2004/0069998 A1 | * | 4/2004 | Harazono | ........................ 257/81 |
| 2009/0145652 A1 | * | 6/2009 | En et al. | ......................... 174/265 |
| 2013/0019470 A1 | * | 1/2013 | Hu et al. | .......................... 29/846 |

* cited by examiner

*Primary Examiner* — Nadine Norton
*Assistant Examiner* — Mahmoud Dahimene
(74) *Attorney, Agent, or Firm* — Rabin & Berdo, P.C.

(57) ABSTRACT

A method of manufacturing plastic metallized 3D circuit includes the steps of providing a 3D plastic main body; performing a surface pretreatment on the plastic main body; performing a metallization process on the plastic main body to deposit a thin metal film thereon; performing a photoresist coating process to form a photoresist protective layer on the thin metal film; performing an exposure and development process on the photoresist protective layer to form a patterned photoresist protective layer; performing an etching process on the exposed thin metal film to form a patterned metal circuit layer; stripping the patterned photoresist protective layer; and performing a surface treatment on the patterned metal circuit layer to form a metal protective layer. With the method, a 3D circuit pattern can be directly formed on a 3D plastic main body without providing additional circuit carrier to thereby meet the requirement for miniaturized and compact electronic devices.

13 Claims, 6 Drawing Sheets

Provide a plastic main body of a 3D structure

Perform a surface pretreatment on surfaces of the plastic main body

Perform a metallization process on the pretreated surfaces of the plastic main body to deposit a thin metal film thereon Perform a photoresist coating process on a surface of the thin metal film to form a photoresist protective layer thereon Perform an exposure and development process on the photoresist protective layer to form a patterned photoresist protective layer Perform an etching process on the thin metal film not covered by the patterned photoresist protective layer to thereby form a patterned metal circuit layer below the patterned photoresist protective layer Perform a stripping process to strip the patterned photoresist protective layer off the patterned metal circuit layer Perform a surface treatment on the surface of the patterned metal circuit layer to form a metal protective layer thereon

FIG. 1

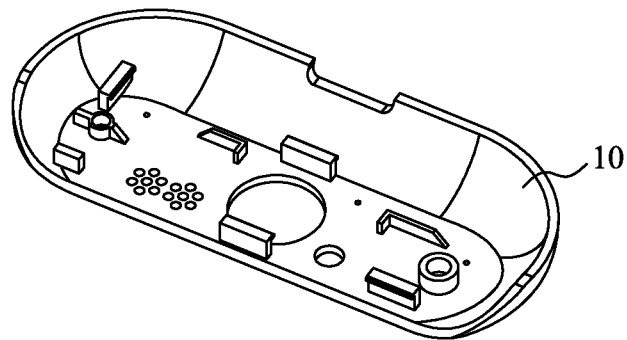
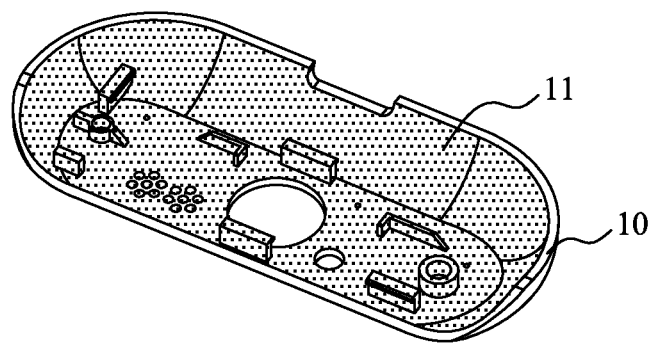
FIG. 2

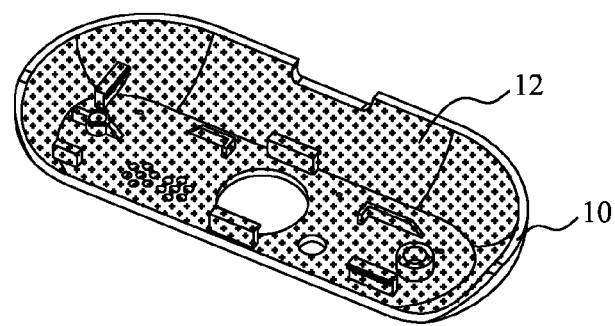
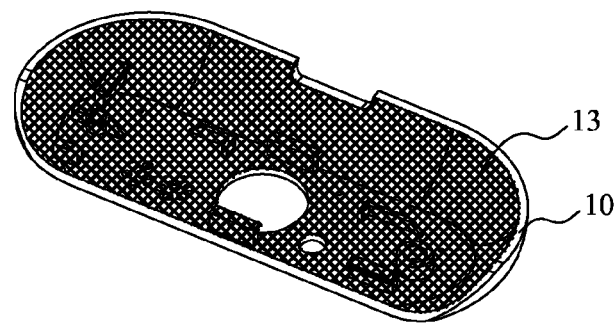
FIG. 3

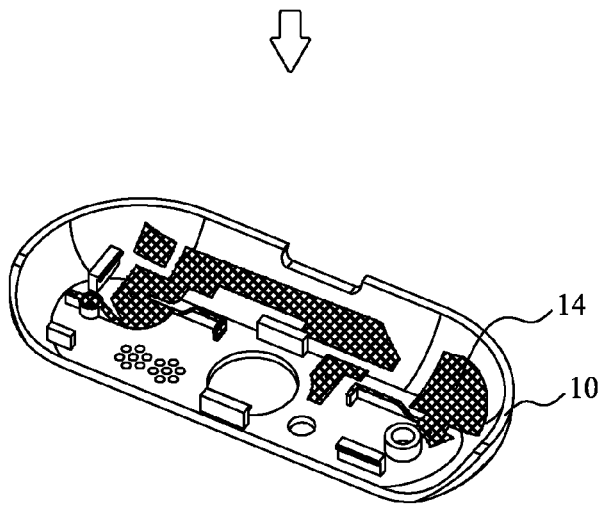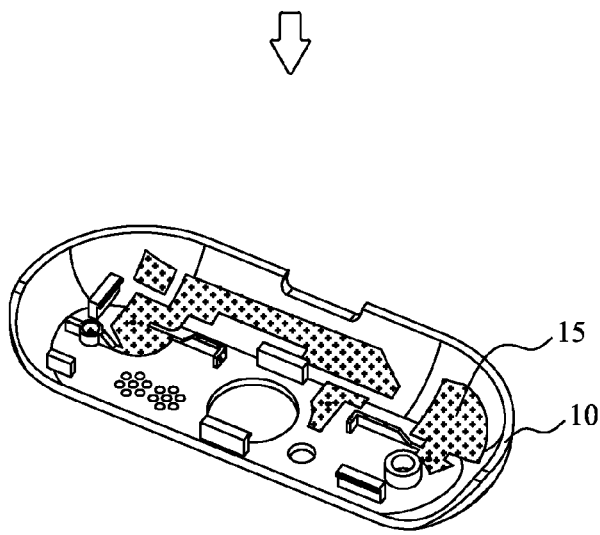
FIG. 5

METHOD OF MANUFACTURING PLASTIC METALLIZED THREE-DIMENSIONAL CIRCUIT

FIELD OF THE INVENTION

The present invention relates to a method of manufacturing plastic metallized three-dimensional (3D) circuit, and more particularly to a method of forming a 3D patterned metal circuit on surfaces of a plastic main body of a 3D structure.

BACKGROUND OF THE INVENTION

With the quick development in the wireless communication technological fields, more attention has been drawn to the requirements for signal transmission quality, compactness and low weight of all kinds of electronic communication devices. Generally, antennas for various kinds of mobile video communication products, such as tablet computers and cellular phones, have differently designed main body structures and circuit arrangements corresponding to the appearances and internal structures of the products, in order to satisfy the requirement for miniaturized communication devices.

According to a currently available forming technique, namely, laser direct structuring (LDS), a specific and laser-activatable plastic material can be injection-molded into a predetermined main body structure, and a laser beam with a specific wavelength is used to activate metal crystal grains doped in the plastic material while simultaneously defining a circuit pattern on the main body. Finally, a metallization process is performed on the main body to obtain a desired circuit. The technique of LDS is frequently applied to different products, including, but not limited to, cellular phones, antennas for mobile computers, light-emitting diode (LED) modules, in-car devices and the like.

However, the plastic material for use with LDS must be doped with a metal catalyst, and the ratio of different components of the doped metal catalyst must be changed according to the type and the material property of the plastic material used. Further, the conditions for laser activation vary with different doped metal catalysts. Therefore, in using the technique of LDS, it is necessary to adjust laser wavelength and control parameters for subsequent metallization process according to the plastic material used and the doped metal catalyst. That is, the LDS technique requires laser equipment that can provide laser beams of specific wavelengths as well as metallization equipment that can be set to different conditions or control parameters, and therefore, requires rather expensive equipment and manufacturing costs.

Moreover, in using the LDS technique, rising of main body surface temperature would cause removal or breakdown of metal crystal grains on part of the main body surfaces or even cause deposition of metal crystal grains on the main body surfaces at areas not expected for forming the circuit, resulting in reduced selectivity of deposited conducting circuit in the subsequent metallization process and accordingly, the problem of short-circuiting between adjacent electronic elements. To prevent any possible short circuit and any possible problem in the subsequent metallization process, it is necessary to control the space between circuit paths during LDS.

However, large space between circuit paths would often cause another problem of insufficient circuit density. It is therefore tried by the inventor to develop a method of manufacturing plastic metallized three-dimensional (3D) circuit to overcome the problems and drawbacks in the conventional techniques for forming circuits on miniaturized electronic devices.

SUMMARY OF THE INVENTION

A primary object of the present invention is to provide a method of manufacturing plastic metallized 3D circuit, so that a 3D circuit structure can be formed on any 3D plastic main body, and a metal circuit layer of the 3D circuit can be optionally formed on any one or more surfaces of the 3D plastic main body to achieve patterned circuit arrangements, which can be applied to a variety of differently configured 3D structures, such as antennas, light-emitting diode (LED) carriers, circuit boards, connectors, electronic devices, steering wheels and the like.

To achieve the above and other objects, the method of manufacturing plastic metallized 3D circuit according to the present invention includes the following steps: providing a plastic main body of a 3D structure; performing a surface pretreatment on surfaces of the plastic main body; performing a metallization process on the pretreated surfaces of the plastic main body to deposit a thin metal film thereon; performing a photoresist coating process on a surface of the thin metal film to form a photoresist protective layer thereon; performing an exposure and development process on the photoresist protective layer to form a patterned photoresist protective layer; performing an etching process on the thin metal film not covered by the patterned photoresist protective layer to thereby form a patterned metal circuit layer; performing a stripping process to strip the patterned photoresist protective layer off the patterned metal circuit layer; and performing a surface treatment on the surface of the patterned metal circuit layer to form a metal protective layer thereon.

In the present invention, the plastic main body is manufactured by injection molding or extrusion molding a material selected from the group consisting of polyethylene (PE), polystyrene (PS), polycarbonate (PC), acrylonitrile-butadiene-styrene (ABS), polyethylene terephthalate (PET), polybutylene terephthalate (PBT), liquid crystal polymers (LCP), polyamide (PA6/6T), nylon, polyoxymethylene (POM), polypropylene (PP), extruded or injected fiberglass, and any composites thereof.

In a preferred embodiment, the surface pretreatment includes surface degreasing, surface roughening, sensitization treatment and activation treatment. And, the surface degreasing includes the use of an acid or an alkaline cleaning agent to remove dirt and grease from the surfaces of the plastic main body.

The surface roughening includes the use of mechanical abrasion, blasting, chemical etching or plasma etching to roughen the degreased surfaces of the plastic main body to such an extent that the surfaces of the plastic main body are modified into hydrophilic porous surfaces, which advantageously enable an increased bonding force between the plastic main body and the metal film formed thereon later. In an operable embodiment, the chemical etching includes the use of a surface roughening agent, such as a mixed solvent of chromate and sulfuric acid, persulfide, hydrogen peroxide, permanganate or a sulfuric acid-based compound, or the use of a strong oxidant produced by a diaphragm electrolysis system, so as to achieve the surface modification of the plastic main body.

In the sensitization treatment, stannous chloride mixes with stannous ions ($Sn_2^+$) contained in an acid solution and then permeates into pores on the roughened surfaces of the plastic main body to thereby adsorb on the surfaces of the plastic main body.

In the activation treatment, palladium chloride mixes with palladium ions ($Pd_2+$) contained in an acid solution and then forms active metal particles in continuous implantation reaction, so as to facilitate subsequent formation of the metal film on the plastic main body through metal deposition.

Further, in the metallization process, a metal material is deposited on the surfaces of the plastic main body to form a thin metal film by low-temperature sputtering or plastic water plating; and the depositing metal material is selected from the group consisting of nickel (Ni), cobalt (Co), palladium (Pd), Tin (Sn), copper (Cu), and any composites thereof.

The photoresist coating process includes dip coating, pad printing, or spray coating of a liquid photoresist to coat the photoresist protective layer on the surface of the thin metal film; and the liquid photoresist for forming the photoresist protective layer can be a positive photoresist or a negative photoresist. Wherein, in the pad printing, a printing pad is used to transfer the liquid photoresist to the surface of the thin metal film to thereby form the photoresist protective layer having a 3D circuit pattern.

In the present invention, the exposure process can be single-sided exposure or double-sided exposure, and includes the irradiation of a laser light source or an ultraviolet (UV) light source directly on areas or positions of the photoresist protective layer defined by a specific 3D exposure circuit pattern. And, the 3D exposure circuit pattern can be a 3D mask mold, a pad printing circuit pattern, or a directly scanned pattern. The 3D mask mold is made of a metal material, a plastic material, or a silicone material; and includes light slots for specific circuit patterns and can therefore serve as a 3D circuit pattern mask for selective exposure.

In the present invention, the development process can be performed by spraying a developing agent or soaking in a developing agent; the etching process can be performed by spraying an etching agent or soaking in an etching agent; and the stripping process can be performed by spraying a stripping agent or soaking in a stripping agent.

In the present invention, the surface treatment includes the use of a chemical plating process to form the metal protective layer; and the metal protective layer is selected from the group consisting of nickel (Ni), copper (Cu), gold (Au), silver (Ag), tin (Sn), chromium (Cr), and any composites thereof.

With the method of manufacturing plastic metallized 3D circuit according to the present invention, the main body can be made of a general plastic material without the need of using a specific material having a doped metal catalyst. Therefore, a wide range of plastic materials can be considered for use to enable reduced material cost. Further, a 3D circuit with complicated circuit pattern can be flexibly manufactured at reduced time and cost without being restricted by mold geometry, machining equipment or complicated circuit structure as in the conventional circuit forming techniques.

Moreover, the patterned metal circuit is integrally formed on the main body, and there is high bonding strength existed between them to save the procedures of assembling independently manufactured plastic main body and metal conducting plate to one another, and to eliminate the problems of separated metal conducting plate and plastic main body due to assembling error or collision.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1 is a flowchart showing the steps included in a method of manufacturing plastic metallized three-dimensional (3D) circuit according to a preferred embodiment of the present invention;

FIG. 2 schematically shows the surface pretreatment of a plastic main body according to the method of the present invention;

FIG. 3 schematically shows the metallization process and metal coating process performed on the plastic main body according to in the method of the present invention;

FIG. 5 schematically shows the etching process and stripping process performed on the plastic main body according to the method of the present invention.

DETAILED DESCRIPTION OF THE PREFERRED EMBODIMENTS

Figure 4:
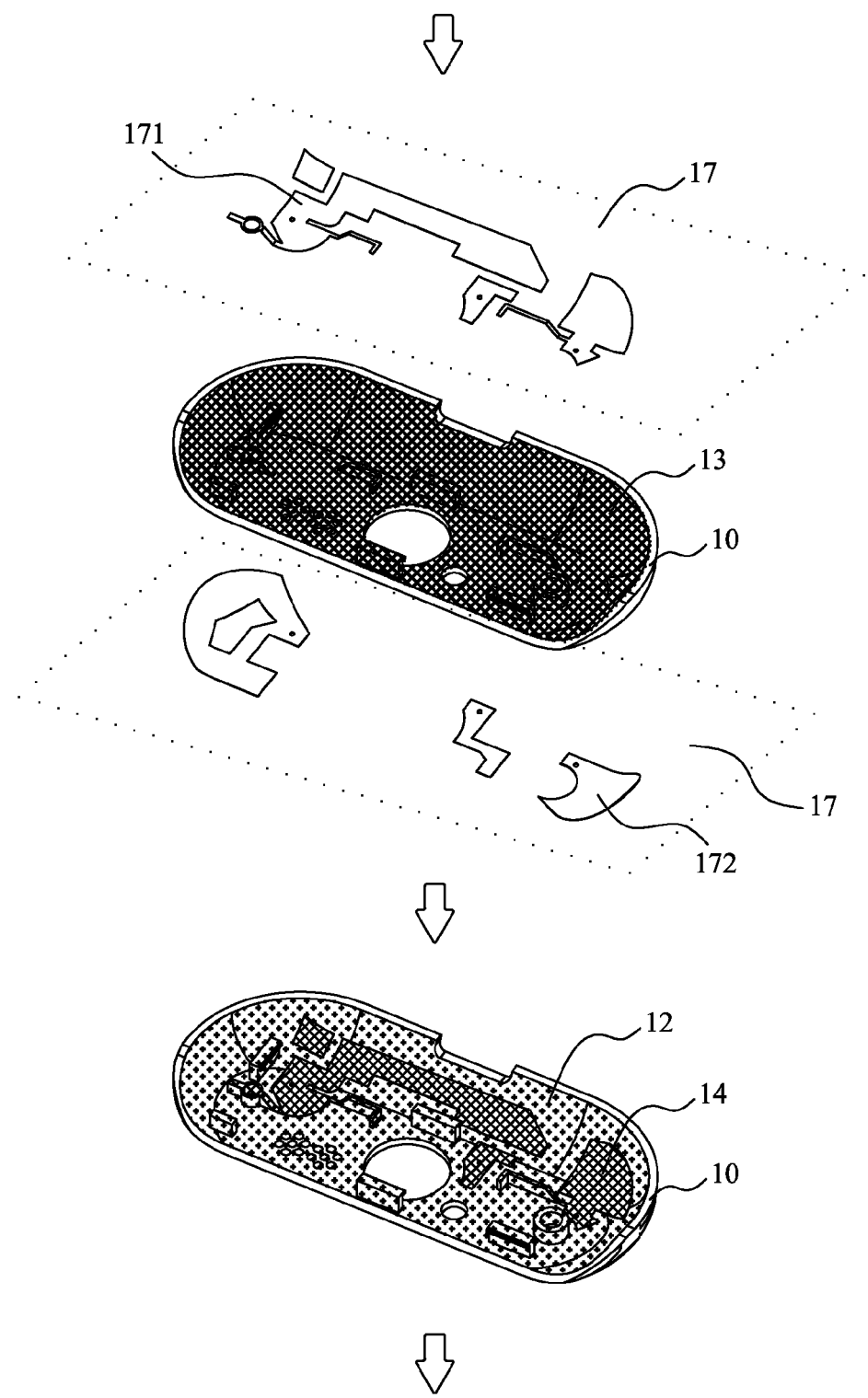
FIG. 4 schematically shows the exposure and development process performed on the plastic main body according to the method of the present invention.

The present invention will now be described with some preferred embodiments thereof and with reference to the accompanying drawings. It is understood the accompanying drawings are illustrated only for reference and to facilitate easy explanation of the present invention, and not intended to restrict the present invention in any way.

FIG. 1 is a flowchart showing the steps included in a method of manufacturing plastic metallized three-dimensional (3D) circuit according to a preferred embodiment of the present invention, and FIGS. 2 to 6 are pictorial representations of different steps of the method of the present invention. Please refer to FIG. 1 along with FIGS. 2 to 6.

In a first step of the method, a main body 10 of a 3D structure is provided. The plastic main body 10 is formed by way of injection molding or extrusion molding.

In a preferred embodiment, the plastic main body 10 is made of a material selected from the group consisting of polyethylene (PE), polystyrene (PS), polycarbonate (PC), acrylonitrile butadiene styrene (ABS), polyethylene terephthalate (PET), polybutylene terephthalate (PBT), liquid crystal polymers (LCP), polyamide (PA6/6T), nylon, polyoxymethylene (POM), polypropylene (PP), extruded or injected fiberglass, and any composites thereof.

As shown in FIG. 2, according to the method of the present invention, the plastic main body 10 is an injection molded bowl-like structure internally defining a recess. In the recess of the main body 10, there is a plurality of different 3D structures, such as irregularly shaped protrusions, vias, curved surfaces, etc.

In the present invention, the main body 10 can be made of a general plastic material without the need of using a specific material having a doped metal catalyst.

Therefore, a wide range of plastic materials can be considered for use to enable reduced material cost. Further, a 3D circuit with complicated circuit pattern can be flexibly manufactured at reduced time and cost without being restricted by mold geometry, machining equipment or complicated circuit structure as in the conventional circuit forming techniques.

In a second step of the method, a surface pretreatment 11 is performed on surfaces of the plastic main body 10. The surface pretreatment 11 includes surface degreasing, surface roughening, sensitization treatment, and activation treatment.

In the surface degreasing, an acid or alkaline cleaning agent is used to remove dirt and grease from the surfaces of the plastic main body 10.

In the surface roughening, mechanical abrasion, blasting, chemical etching or plasma etching is used to roughen the degreased surfaces of the plastic main body 10 to such an extent that the surfaces of the plastic main body 10 are modified into hydrophilic porous surfaces, which advantageously enable an increased bonding force between the plastic main body 10 and the metal film formed thereon later.

In an operable embodiment, the chemical etching includes the use of a surface roughening agent, such as a mixed solvent of chromate and sulfuric acid, persulfide, hydrogen peroxide, permanganate or a sulfuric acid-based compound, or the use of a strong oxidant produced by a diaphragm electrolysis system to achieve the surface modification of the plastic main body 10.

In the sensitization treatment, stannous chloride mixes with stannous ions ($Sn_2^+$) contained in an acid solution and then permeates into pores on the roughened surfaces of the plastic main body 10 to thereby adsorb on the surfaces of the plastic main body 10.

In the activation treatment, palladium chloride mixes with palladium ions ($Pd_2+$) contained in an acid solution and then forms active metal particles in continuous implantation reaction, so as to facilitate subsequent formation of a metal film on the plastic main body 10 through metal deposition.

As shown in FIG. 2, the surface degreasing, the surface roughening, the sensitization treatment, and the activation treatment are performed on both of the inner and the outer surface of the plastic main body 10 for removing dirt and grease therefrom, modifying the roughened inner and outer surfaces into hydrophilic porous surfaces, adsorbing the stannous ions, and activating the implantation reaction to form active metal particles to facilitate the forming of a metal film on the plastic main body 10 through metal deposition later.

In a third step of the method, a metallization process is performed on the surfaces of the plastic main body 10, so that a thin metal film 12 is deposited on all the pretreated surfaces of the plastic main body 10. In the metallization process, a metal material is deposited on the surfaces of the plastic main body 10 to form the thin metal film 12 by low-temperature sputtering or plastic water plating.

In a preferred embodiment, the depositing metal can be nickel (Ni), cobalt (Co), palladium (Pd), Tin (Sn), copper (Cu) or any composites thereof.

As shown in FIG. 3, the metal deposition is performed on the surfaces of the plastic main body 10 that have been pretreated in the second step, so that the thin metal film 12 is formed on all of the irregularly shaped protrusions, vias and curved surfaces. With the vias formed on the plastic main body 10, the thin metal film 12 on the inner and on the outer surface of the plastic main body 10 are electrically connectable to each other.

In a fourth step of the method, a photoresist coating process is performed, so that a photoresist protective layer 13 is formed on the surface of the thin metal film 12. The photoresist coating process includes dip coating, pad printing, or spray coating of a liquid photoresist to form the photoresist protective layer 13 on the surface of the thin metal film 12. In the pad printing, a printing pad is used to transfer the liquid photoresist to the surface of the thin metal film 12 to thereby form the photoresist protective layer 13 having a 3D circuit pattern.

In a preferred embodiment, the liquid photoresist for forming the photoresist protective layer 13 can be a positive or a negative photoresist.

As shown in FIG. 3, the photoresist protective layer 13 is formed on the plastic main body 10 at areas that have been subjected to the metallization process in the third step, including the above-mentioned irregularly shaped protrusions, vias, and curved surfaces.

In a fifth step of the method, an exposure and development process 17 is performed on the photoresist protective layer 13 to form a patterned photoresist protective layer 14. The exposure process may be single-sided or double-sided exposure; and the development process may be performed by spraying a developing agent or soaking in a developing agent.

In a preferred embodiment, the exposure process includes the irradiation of a laser light source or an ultraviolet (UV) light source directly on areas or positions of the photoresist protective layer 13 defined by a specific 3D exposure circuit pattern. The 3D exposure circuit pattern may be a 3D mask mold, a pad printing circuit pattern, or a directly scanned pattern. Further, the 3D mask mold may be made of a metal material, a plastic material or a silicone material, and includes light slots for specific circuit patterns, so that the 3D mask mold may serve as a 3D circuit pattern mask for selective exposure.

As shown in FIG. 4, in the present invention, the double-sided exposure is performed on the plastic main body 10, so that a first exposure pattern 171 is formed on an inner side of the plastic main body 10 while a second exposure pattern 172 is formed on an outer side of the plastic main body 10. Then, the photoresist protective layer is partially dissolved by a developing agent and thereby forms the patterned photoresist protective layer 14.

In a sixth step of the method, an etching process is performed on the thin metal film 12 exposed from the patterned photoresist protective layer 14 to thereby form a patterned metal circuit layer 15 below the patterned photoresist protective layer 14. Wherein, the etching process may be performed by spraying an etching agent or soaking in an etching agent.

As shown in FIG. 5, the thin metal film 12 located below and protected by the patterned photoresist protective layer 14 is not etched by the etching agent to thereby directly form the patterned metal circuit layer 15 corresponding to the patterned photoresist protective layer 14.

In a seventh step of the method, a stripping process is performed to strip the patterned photoresist protective layer 14 off the patterned metal circuit layer 15. Wherein, the stripping process is performed by spraying or soaking in a stripping agent.

As shown in FIG. 5, the patterned photoresist protective layer 14 covering the patterned metal circuit layer 15 is completely stripped off using a stripping agent to expose the patterned metal circuit layer 15.

In an eighth step of the method, a surface treatment is performed on the surface of the patterned metal circuit layer 15 to form a metal protective layer 16. The surface treatment includes the use of a chemical plating process, i.e. an electroless plating process, to form the metal protective layer 16.

In a preferred embodiment, the metal protective layer 16 can be formed of nickel (Ni), copper (Cu), gold (Au), silver (Ag), tin (Sn), chromium (Cr) or any composites thereof.

Figure 6:
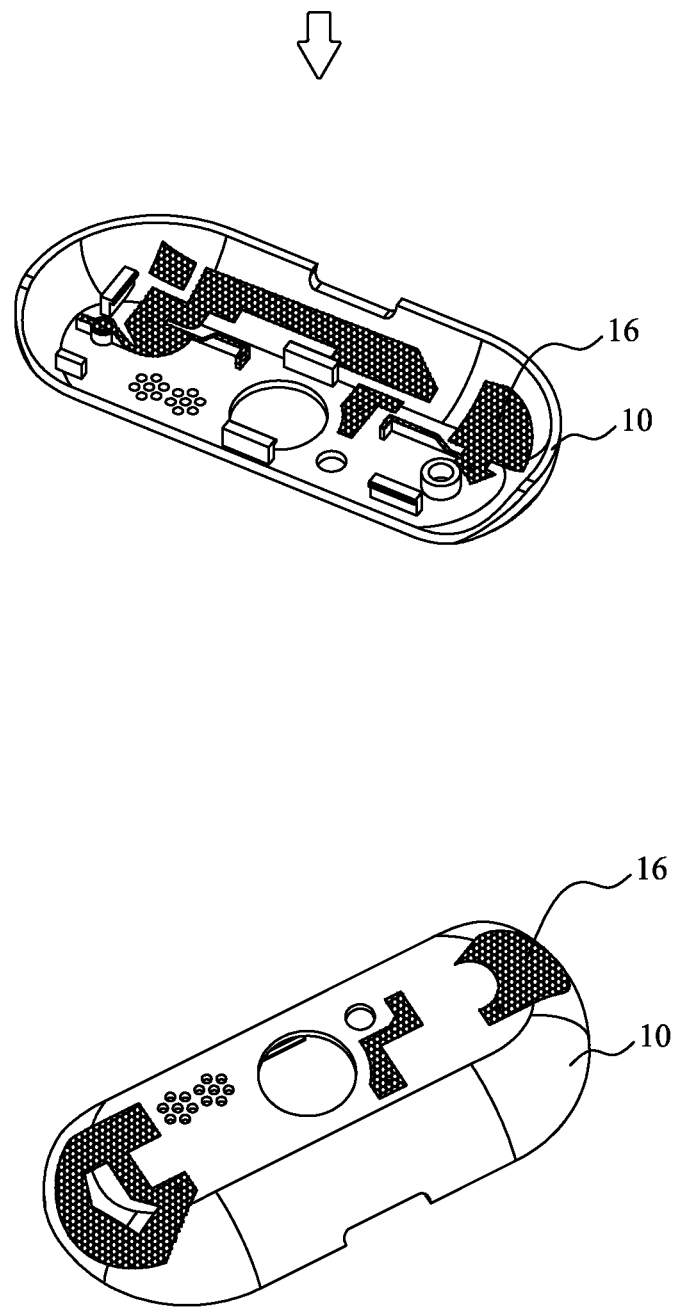
FIG. 6 schematically shows the plastic main body is subjected to a surface treatment according to the method of the present invention to form a metal protective layer thereon.

As shown in FIG. 6, in the present invention, a chemical plating process is performed on the patterned metal circuit layer 15 formed on the inner and outer surfaces of the plastic main body 10, so that the metal circuit layer 15 has an increased thickness to form the metal protective layer 16, which gives the metal circuit layer further enhanced anti-oxidation ability and weldability.

In summary, with the method of manufacturing plastic metallized 3D circuit according to the present invention, a 3D circuit can be formed on any 3D plastic main body. The metal circuit layer of the 3D circuit can be optionally formed on any one or more surfaces of the 3D plastic main body to achieve a patterned circuit arrangement, which can be applied to a variety of differently configured 3D structures, such as antennas, LED carriers, circuit boards, connectors, electronic devices, steering wheels and the like without the need of additionally providing a circuit carrier within the main body. Therefore, it is possible to reduce the volume of the main bodies to meet the requirements for using in miniaturized, compact and low weight electronic devices.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A method of manufacturing a plastic metallized three-dimensional (3D) circuit, comprising the following steps:
   (1) providing a plastic main body of a 3D structure;
   (2) performing a surface pretreatment on surfaces of the plastic main body, wherein the surface pretreatment includes surface degreasing, surface roughening, sensitization treatment and activation treatment performed in that stated order;
   (3) performing a metallization process, that is one of low-temperature sputtering and plastic water plating, on the pretreated surfaces of the plastic main body to deposit a thin metal film thereon;
   (4) performing a photoresist coating process on a surface of the thin metal film to form a photoresist protective layer thereon through any one of dip coating and spray coating;
   (5) performing an exposure and development process on the photoresist protective layer to form a patterned photoresist protective layer, wherein the exposure process is one of a single-sided exposure and a double-sided exposure, and includes irradiation from one of a laser light source and an ultraviolet light source directly on areas of the photoresist protective layer defined by a specific 3D exposure circuit pattern or positions of the photoresist protective layer defined by the specific 3D exposure circuit pattern, and the 3D exposure circuit pattern is a directly scanned pattern;
   (6) performing an etching process on parts of the thin metal film not covered by the patterned photoresist protective layer to thereby form a patterned metal circuit layer below the patterned photoresist protective layer;
   (7) performing a stripping process to strip the patterned photoresist protective layer off the patterned metal circuit layer; and
   (8) performing a surface treatment on a surface of the patterned metal circuit layer by a chemical plating process to form a metal protective layer composed of metal thereon.

2. The method of manufacturing plastic metallized 3D circuit as claimed in claim 1, wherein the plastic main body is made of a material selected from the group consisting of polyethylene (PE), polystyrene (PS), polycarbonate (PC), acrylonitrile-butadiene- styrene (ABS), polyethylene terephthalate (PET), polybutylene terephthalate (PBT), liquid crystal polymers (LCP), polyamide (PA6/6T), nylon, polyoxymethylene (POM), polypropylene (PP), extruded or injected fiberglass, and any composites thereof.

3. The method of manufacturing plastic metallized 3D circuit as claimed in claim 1, further comprising forming the plastic main body in a manner selected from the group consisting of injection molding and extrusion molding.

4. The method of manufacturing plastic metallized 3D circuit as claimed in claim 1, wherein the surface degreasing includes the use of an acid or an alkaline cleaning agent to remove dirt and grease from the surfaces of the plastic main body.

5. The method of manufacturing plastic metallized 3D circuit as claimed in claim 1, wherein the surface roughening includes the use of any one of mechanical abrasion, blasting, chemical etching and plasma etching to roughen the degreased surfaces of the plastic main body to such an extent that the surfaces of the plastic main body are modified into hydrophilic porous surfaces, which enable an increased bonding force between the plastic main body and the thin metal film formed thereon later.

6. The method of manufacturing plastic metallized 3D circuit as claimed in claim 4, wherein the surface roughening uses chemical etching so as to achieve surface modification of the plastic main body, and the chemical etching includes any one of
   using a surface roughening agent, including a mixed solvent of chromate and sulfuric acid, persulfide, hydrogen peroxide, permanganate or a sulfuric acid-based compound, and
   using a strong oxidant produced by a diaphragm electrolysis system.

7. The method of manufacturing plastic metallized 3D circuit as claimed in claim 1, wherein, in the sensitization treatment, stannous chloride mixes with stannous ions, including $Sn_2^+$, contained in an acid solution and then permeates into pores on the roughened surfaces of the plastic main body that are formed by the surface roughening to thereby adsorb the stannous ions on the roughened surfaces of the plastic main body.

8. The method of manufacturing plastic metallized 3D circuit as claimed in claim 1, wherein, in the activation treatment, palladium chloride mixes with palladium ions, including $Pd_2+$, contained in an acid solution and then forms active metal particles in a continuous implantation reaction, so as to facilitate subsequent formation of the thin metal film in the metallization process through metal deposition.

9. The method of manufacturing plastic metallized 3D circuit as claimed in claim 1, wherein, in the metallization process, a metal material is deposited on the pretreated surfaces of the plastic main body to form the thin metal film, and the depositing metal material is selected from the group consisting of nickel (Ni), cobalt (Co), palladium (Pd), tin (Sn), copper (Cu), and any composites thereof.

10. The method of manufacturing plastic metallized 3D circuit as claimed in claim 1, wherein the photoresist coating process includes coating of a liquid photoresist on the surface of the thin metal film to form the photoresist protective layer, and the liquid photoresist for forming the photoresist protective layer is selected from the group consisting of a positive photoresist and a negative photoresist.

11. The method of manufacturing plastic metallized 3D circuit as claimed in claim 1, wherein
   the development process is performed by any one of spraying a developing agent on the photoresist protective layer and soaking the photoresist protective layer in a developing agent;

the etching process is performed by any one of spraying an etching agent on the parts of the thin metal film and soaking the parts of the thin metal film in an etching agent; and the stripping process is performed by any one of spraying a stripping agent on the patterned photoresist protective layer and soaking the patterned photoresist protective layer a stripping agent.

12. The method of manufacturing plastic metallized 3D circuit as claimed in claim 1, wherein the metal protective layer is formed of a material selected from the group consisting of nickel (Ni), copper (Cu), gold (Au), silver (Ag), tin (Sn), chromium (Cr), and any composites thereof.

13. The method of manufacturing plastic metallized 3D circuit as claimed in claim 1, wherein the sensitization treatment includes adsorbing stannous ions in the plastic main body, and the activation treatment includes forming active metal particles in a continuous implantation reaction.

* * * * *